(12) United States Patent
Aras et al.

(10) Patent No.: US 8,854,064 B2
(45) Date of Patent: Oct. 7, 2014

(54) TOUCH SENSING METHOD AND APPARATUS

(75) Inventors: Sualp Aras, Dallas, TX (US); Tatsuyuki Nihei, Tokyo (JP); Abidur Rahman, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 686 days.

(21) Appl. No.: 13/184,292

(22) Filed: Jul. 15, 2011

(65) Prior Publication Data

US 2013/0015867 A1    Jan. 17, 2013

(51) Int. Cl.
| | |
|---|---|
| G01R 27/26 | (2006.01) |
| G01R 27/28 | (2006.01) |
| G06F 3/041 | (2006.01) |
| G01F 7/00 | (2006.01) |
| H03M 11/02 | (2006.01) |
| H03M 3/00 | (2006.01) |
| G01D 5/24 | (2006.01) |
| G06F 3/044 | (2006.01) |
| G01P 15/125 | (2006.01) |

(52) U.S. Cl.
CPC .............. G06F 3/044 (2013.01); G01P 15/125 (2013.01); H03M 11/02 (2013.01); H03M 3/34 (2013.01); G01D 5/24 (2013.01); H03M 3/458 (2013.01)
USPC ........... 324/684; 324/690; 324/649; 345/173; 702/47

(58) Field of Classification Search
CPC ....... H03M 11/02; H03M 3/34; H03M 3/458; G06F 3/044; G01D 5/24; G01P 15/125
USPC ................. 324/658–690, 649; 345/173, 174; 702/47, 52
See application file for complete search history.

(56) References Cited

U.S. PATENT DOCUMENTS

| | | |
|---|---|---|
| 5,463,388 A | 10/1995 | Boie et al. |
| 7,764,274 B2 | 7/2010 | Westerman et al. |
| 2007/0074913 A1* | 4/2007 | Geaghan et al. ........... 178/18.06 |
| 2008/0116904 A1 | 5/2008 | Reynolds et al. |
| 2008/0158175 A1 | 7/2008 | Hotelling et al. |
| 2009/0066674 A1 | 3/2009 | Maharyta et al. |

(Continued)

FOREIGN PATENT DOCUMENTS

WO    WO2007044360    4/2007

OTHER PUBLICATIONS

PCT Search Report mailed Dec. 26, 2012.

*Primary Examiner* — Melissa Koval
*Assistant Examiner* — Farhana Hoque
(74) *Attorney, Agent, or Firm* — John J. Patti; Frederick J. Telecky, Jr.

(57) ABSTRACT

A method for measuring for generating a touch capacitance measurement is provided. Gain and offset control signals are generated, where the gain and offset control signals are adjusted to compensate for base capacitance of a touch sensor. The gain control signal is applied to a touch sensor during a first phase of a clock signal, and the offset control signal is applied to an output circuit during a second phase of the clock signal. The output circuit is coupled to the touch sensor during the second phase of the clock signal. The touch capacitance measurement is generated by compensating for the base capacitance with the gain and offset control signals, and a gain is applied to the touch capacitance measurement.

19 Claims, 2 Drawing Sheets

(56) References Cited

U.S. PATENT DOCUMENTS

| | | |
|---|---|---|
| 2009/0153152 A1 | 6/2009 | Maharyta et al. |
| 2009/0231286 A1 | 9/2009 | Kuo |
| 2010/0201382 A1 | 8/2010 | Welland |
| 2010/0315363 A1 | 12/2010 | Kobayashi et al. |
| 2010/0321331 A1 | 12/2010 | Oda et al. |
| 2011/0109585 A1 | 5/2011 | Kwon et al. |

* cited by examiner

TOUCH SENSING METHOD AND APPARATUS

TECHNICAL FIELD

The invention relates generally to a capacitive touch sensors and, more particularly, to sensing small changes in capacitive touch sensors.

BACKGROUND

Capacitive touch sensors (such as touch buttons) are increasing used in human interface devices. These touch sensors usually have a base capacitance and function based on detection of an increase in the base capacitance due to the presence of a dielectric (i.e., finger) in proximity to the sensor. With some touch sensors, this change or variation in base capacitance (which can be referred to as the touch capacitance) can be as small as 0.5%. This means that, if a 10-bit successive approximation register (SAR) analog-to-digital converter (ADC) is employed to digitize the measurement, the touch capacitance measurement may be limited to approximately the 5 least significant bits. Thus, there is a high susceptibility to error due to noise. Additionally, the base capacitance can drift over time, which can create further errors. Therefore, there is a need for an improved touch controller that can accurately measure small touch capacitances.

Some examples of conventional systems are: U.S. Pat. No. 5,463,388; U.S. Pat. No. 7,764,274; U.S. Patent Pre-Grant Publ. No. 2007/0074913; U.S. Patent Pre-Grant Publ. No. 2008/0116904; U.S. Patent Pre-Grant Publ. No. 2009/0066674; U.S. Patent Pre-Grant Publ. No. 2009/0153152; U.S. Patent Pre-Grant Publ. No. 2010/0201382; and PCT Publ. No. WO2007044360.

SUMMARY

An embodiment of the present invention, accordingly, provides an apparatus. The apparatus comprises an interface that is configure to communicate with a touch sensor having a base capacitance; and an capacitance-to-voltage converter that receives a clock signal and that is coupled to the interface, wherein the capacitance-to-voltage converter generates gain control and offset signals, and wherein the capacitance-to-voltage converter is configured to apply the gain control signals to the touch sensor during a first phase of the clock signal, and the gain and offset control signals are adjusted to compensate for the base capacitance, and wherein the capacitance-to-voltage converter uses the gain and offset control signals during a second phase of the clock signal to compensate for the base capacitance and provide a touch capacitance measurement.

In accordance with an embodiment of the present invention, the output circuit includes a capacitor that is configured to be adjustable.

In accordance with an embodiment of the present invention, the capacitance-to-voltage converter further comprises: a gain control circuit that is coupled to the interface and that receives the clock signal; an output circuit that is coupled to the gain control circuit, wherein the output circuit includes the capacitor; and an offset control circuit that is coupled to the output circuit and that receives the clock signal.

In accordance with an embodiment of the present invention, the gain control circuit further comprises: a first transmission gate that is coupled between the interface and the output circuit and that is activated during the second phase of the clock signal; a second transmission gate that is coupled to the interface and that is activated during the first phase of the clock signal; and a digital-to-analog converter (DAC) that is coupled to the second transmission gate and that generates the gain control signal.

In accordance with an embodiment of the present invention, the DAC further comprises a first DAC, and wherein the gain control circuit further comprises: a second DAC that generates the offset control signal; a third transmission gate that is coupled between the second DAC and the output circuit and that is activated during the second phase of the clock signal; and a fourth transmission gate that is coupled to the output circuit and that is activated during the first phase of the clock signal.

In accordance with an embodiment of the present invention, the clock signal further comprises a first clock signal, and wherein the capacitor further comprises a first capacitor, and wherein the output circuit further comprises: a second capacitor that is coupled to the third and fourth transmission gates; an amplifier having a first input terminal, a second input terminal, and a output terminal, wherein the first input terminal of the amplifier is coupled to the second capacitor and the first transmission gate, and wherein the first capacitor is coupled between the first input terminal of the amplifier and the output terminal of the amplifier, and wherein the second input terminal of the amplifier receives a common mode voltage; and a fifth transmission gate that is controlled by the second clock signal and that is coupled between the first input terminal of the amplifier and the output terminal of the amplifier.

In accordance with an embodiment of the present invention, an apparatus is provided. The apparatus comprises a touch panel having a plurality of touch sensors, wherein each touch sensor has a base capacitance; a touch panel controller having: an interface that is coupled to each touch sensor; a capacitance-to-voltage converter having: a gain control circuit that is coupled to the interface and that receives a clock signal, wherein the gain control circuit generates a gain control signal, and wherein the gain control circuit is configured to apply the gain control signal to a selected touch sensor from the plurality of touch sensors during a first phase of the clock signal; an output circuit that is coupled to the gain control circuit, wherein the output circuit is configured to be coupled to the touch sensor during a second phase of the clock signal; and an offset control circuit that is coupled to the output circuit and that receives the clock signal, wherein the offset control circuit generates an offset control signal, and wherein the offset control circuit applies the offset control signal to the output circuit during the second phase of the clock signal, and wherein the gain and offset control signals are adjusted to compensate for the base capacitance of the selected touch sensor.

In accordance with an embodiment of the present invention, the capacitor further comprises a first capacitor, and wherein the output circuit further comprises: a second capacitor that is coupled to the offset control circuit; and an amplifier having a first input terminal, a second input terminal, and a output terminal, wherein the first input terminal of the amplifier is coupled to the second capacitor and the gain control circuit, and wherein the first capacitor is coupled between the first input terminal of the amplifier and the output terminal of the amplifier, and wherein the second input terminal of the amplifier receives a common mode voltage.

In accordance with an embodiment of the present invention, the clock signal further comprises a first clock signal, and wherein the output circuit further comprises a first transmission gate that is controlled by the second clock signal and that is coupled between the first input terminal of the amplifier and the output terminal of the amplifier.

In accordance with an embodiment of the present invention, the gain control circuit further comprises: a DAC that generates the offset control signal; a second transmission gate that is coupled between the DAC and the second capacitor and that is activated during the second phase of the clock signal; and a third transmission gate that is coupled to the second capacitor and that is activated during the first phase of the clock signal.

In accordance with an embodiment of the present invention, the DAC further comprises a first DAC, and wherein the gain control circuit further comprises: a fourth transmission gate that is coupled between the interface and the first input terminal of the amplifier and that is activated during the second phase of the clock signal; a fifth transmission gate that is coupled to the interface and that is activated during the first phase of the clock signal; and a second DAC that is coupled to the second transmission gate and that generates the gain control signal.

In accordance with an embodiment of the present invention, the touch panel controller further comprises: an analog-to-digital converter (ADC) that is coupled to the output terminal of the amplifier; a digital front end (DFE) that is coupled to the ADC; and control logic that is coupled to the DFE, the first and second DACs, and the first, second, third, fourth, and fifth transmission gates.

In accordance with an embodiment of the present invention, the ADC is a successive approximation register (SAR) ADC.

In accordance with an embodiment of the present invention, the DFE provides noise cancellation using correlated double sampling (CDS).

In accordance with an embodiment of the present invention, a method is provided. The method comprises generating gain and offset control signals, wherein the gain and offset control signals are adjusted to compensate for base capacitance of a touch sensor; applying the gain control signal to a touch sensor during a first phase of a clock signal; applying the offset control signal to an output circuit during a second phase of the clock signal; coupling the output circuit to the touch sensor during the second phase of the clock signal; compensating for the base capacitance with the gain and offset control signals to generate a touch capacitance measurement; and applying a gain to the touch capacitance measurement.

In accordance with an embodiment of the present invention, the step of applying the gain control signal further comprises coupling a DAC to the touch sensor during the first phase of the clock signal.

In accordance with an embodiment of the present invention, the method further comprises converting the touch measurement with the applied gain to a digital signal.

In accordance with an embodiment of the present invention, the method further comprises performing a CDS operation on the digital signal to compensate for noise.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
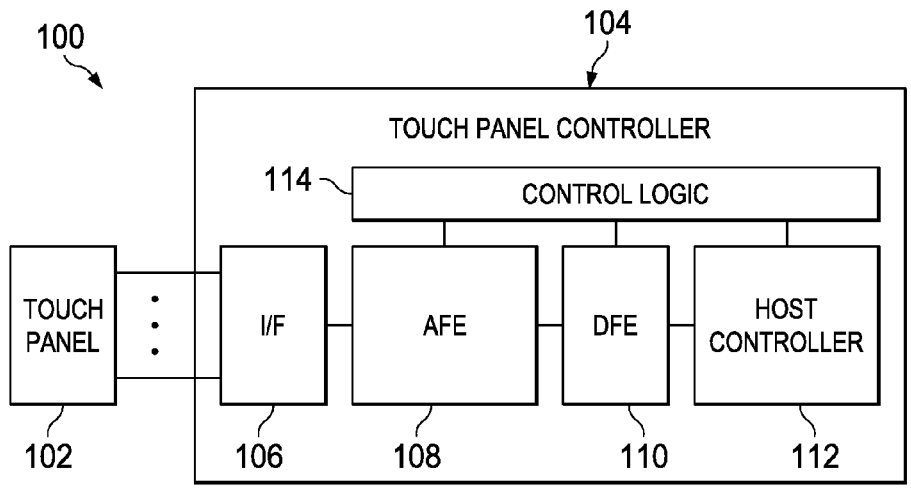
FIG. 1 is a diagram of an example of a system in accordance with an embodiment of the present invention.

Refer now to the drawings wherein depicted elements are, for the sake of clarity, not necessarily shown to scale and wherein like or similar elements are designated by the same reference numeral through the several views.

Turning to FIG. 1, a system 100 in accordance with an embodiment of the present invention can be seen. As shown, the system 100 generally comprises a touch panel 102 and a touch panel controller 104. The touch panel 102 generally comprises one or more touch sensors (such as touch buttons) arranged in a variety of ways (i.e., an array or line), and the touch panel controller 104 generally comprises an interface or I/F 106, an AFE 108, a digital front end (DFE) 110, host controller 112, and control logic 114.

In operation, the touch panel controller 114 is able to detect touch events on the touch panel 106. To accomplish this, the touch panel controller 104 is able to "scan through" or select various touch sensors on the touch panel 102. The scanning or selection is normally accomplished with the interface 106 (which may include a multiplexer) so as to allow an appropriate or selected touch sensor to be coupled to the AFE 108. Once coupled to the selected touch sensor through the interface 106, the AFE 108 determines whether a touch event with the selected touch sensor has occurred with the use of control signals (i.e., clock signal) provided by the control logic 114. The AFE 108 is able to digitize a measurement for the touch event (which should be a measurement of the touch capacitance) for the DFE 110. The DFE 110 (which also can receive control signals from the control logic 114) can then perform error correction on the digitized measurement as well as other operations for the host controller 112.

Figure 2:
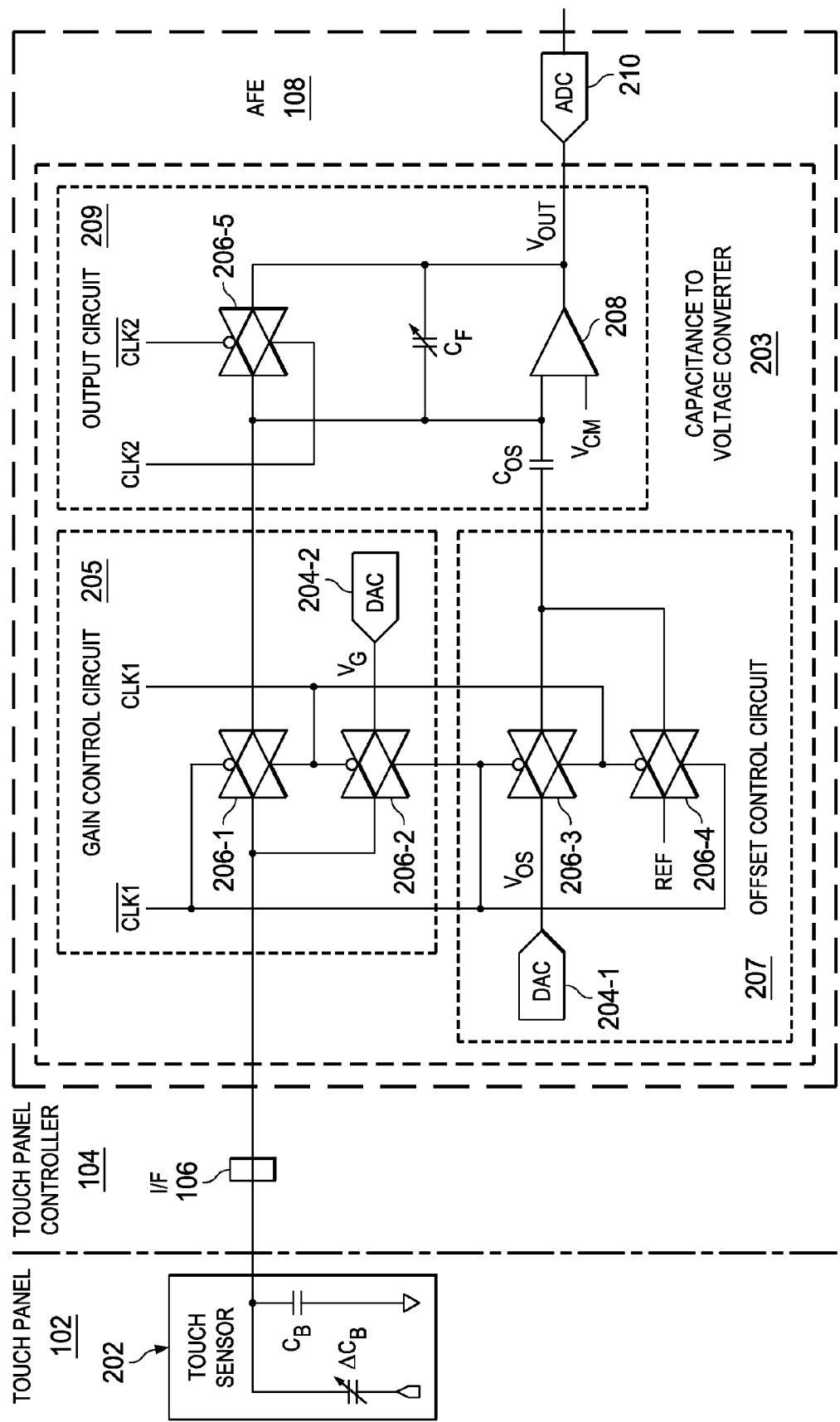
FIG. 2 is a diagram of a detailed example of a portion of the analog front end (AFE) and a touch sensor for the system of FIG. 1.

Performing the measurement of the touch capacitance, however, can be difficult, but the AFE 108 (which is shown in greater detail in FIG. 2) is able to perform this measurement with relative ease. As shown in the example in FIG. 2, one of the touch sensors 202 from the touch panel 102 is coupled to the capacitance-to-voltage converter 203 of AFE 108 through interface 106, and this touch sensor 202 is shown to formed of two capacitors $C_B$ and $\Delta C_B$ (which represent the base capacitance and touch capacitance, respectively). The AFE 108 is generally comprised of a gain control circuit 205, offset control circuit 207, and output circuit 209. The gain and offset control circuits 205 and 207 generally receive a clock signal CLK1 and inverse clock signal $\overline{CLK1}$ from control logic 114, while output circuit 209 receives a clock signal CLK2 and inverse clock signal $\overline{CLK2}$ from control logic 114. These signals CLK1, $\overline{CLK1}$, CLK2, and $\overline{CLK2}$ are used by the transmission gates 206-1 to 206-5 such that transmission gates 206-2 and 206-4 are open when clock signal CLK1 is logic high (i.e., one phase of clock signal CLK1), transmission gates 206-1 and 206-3 are open when clock signal CLK1 is logic low (i.e., another phase of clock signal CLK1), and transmission gate 206-5 is open when clock signal CLK2 is logic high. With this configuration, digital-to-analog converter (DAC) 204-2 (which is controlled by the control logic 114) is able to provide a gain control signal $V_G$ to the touch sensor 202 during one phase of clock signal CLK1 (i.e., when CLK1 is logic high), while reference voltage REF is applied to the capacitor $C_{OS}$ during this same phase. This allows the capacitors $C_B$, $\Delta C_B$, and $C_{OS}$ to be charged. Then, during another phase of clock signal CLK1 (i.e., when clock signal CLK1 is logic low), the capacitors $C_B$ and $\Delta C_B$ are coupled to the amplifier 208 (preferably at its inverting terminal), and the offset control signal $V_{OS}$ is applied to capacitor $C_{OS}$ from DAC 204-1. Additionally, the amplifier 208 receives a common mode voltage $V_{CM}$ (preferably at its non-inverting terminal). Amplifier 208, with the use of capacitor $C_F$ (which is adjustable) and transmission gate 206-5, apply a gain and generate an output signal $V_{out}$ (which corresponds to an amplified measurement of the touch capacitance or the capacitance for capacitor $\Delta C_B$) for ADC 210 (which can, for example, be a 10-bit SAR ADC).

Figure 3:
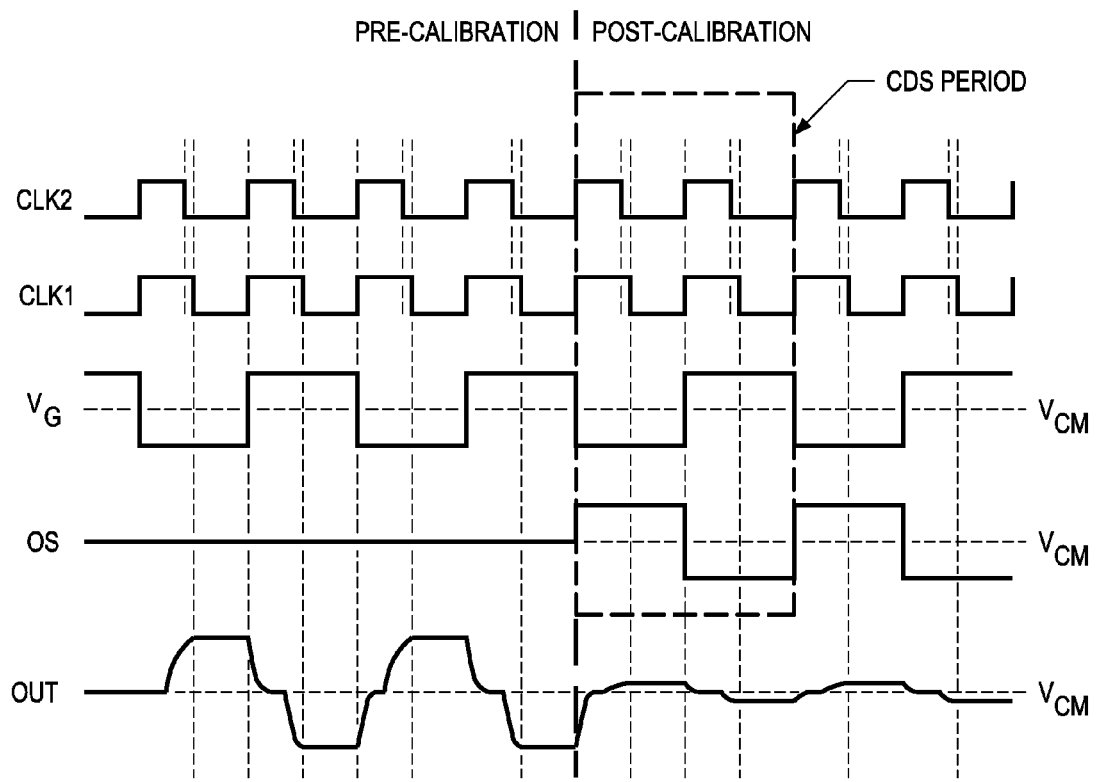
FIG. 3 is a diagram of an example of the operation of the AFE and touch sensor of FIG. 2.

Typically, as shown in FIG. 3, the gain and offset control signals $V_G$ and $V_{OS}$ are modulated signals that are adjusted to compensate for the base capacitance. Typically, these signals $V_G$ and $V_{OS}$ can be represented as:

$$V_G = \Delta V_G \pm V_{CM} \quad (1)$$

$$V_{OS} = \Delta V_{OS} \pm V_{CM} \quad (2)$$

As shown in the pre-calibration phase (i.e., prior to the adjustment of the gain and offset control signals $V_G$ and $V_{OS}$), the offset control signal $V_{OS}$ is set to the common mode voltage $V_{CM}$, which results in the output signal $V_{OUT}$ being:

$$V_{OUT} = \frac{\Delta V_G}{C_F} C_B + V_{CM} \quad (3)$$

Additionally, when the offset voltage $V_{OS}$ is applied in the post-calibration phase, the output signal $V_{OUT}$ is:

$$V_{OUT} = \frac{\Delta V_G}{C_F} C_B - \frac{\Delta V_{OS}}{C_F} C_{OS} + V_{CM} \quad (4)$$

Since, the output voltage $V_{OUT}$ for the pre-calibration phase (as shown in equation (3)) is a function of the capacitance of capacitor $C_B$, system 100 (i.e., host controller 112 or control logic 114) can adjust the offset control signal $V_{OS}$ such that:

$$\frac{\Delta V_G}{C_F} C_B = \frac{\Delta V_{OS}}{C_F} C_{OS} \Rightarrow \Delta V_{OS} = \frac{C_B}{C_{OS}} \Delta V_G \quad (5)$$

This results in the output signal $V_{OUT}$ being approximately equal to the common mode voltage $V_{CM}$ when the capacitance of capacitor $\Delta C_B$ is approximately zero so as to, effectively, "cancel out" the capacitance of capacitor $C_B$. When the capacitance of capacitor $\Delta C_B$ is non-zero (i.e., when a touch event occurs), the output signal $V_{OUT}$ is:

$$\begin{aligned}
V_{OUT} &= \frac{\Delta V_G}{C_F}(C_B + \Delta C_B) - \frac{\Delta V_{OS}}{C_F} C_{OS} + V_{CM} \\
&= \left[\frac{\Delta V_G}{C_F} C_B - \frac{\Delta V_{OS}}{C_F} C_{OS}\right] + \frac{\Delta V_G}{C_F} \Delta C_B + V_{CM} \\
&= \frac{\Delta V_G}{C_F} \Delta C_B + V_{CM},
\end{aligned} \quad (6)$$

which is a function of the capacitance of capacitor $\Delta C_B$. Thus, once calibrated, capacitance-to-voltage converter 203 is able to accurately measure the touch capacitance or capacitance of capacitor $\Delta C_B$. Additionally, as indicated by equation (6), the capacitor $C_F$ can operate as a gain control element to boost sensitivity.

With an accurate measurement of the touch capacitance, DFE 110 can perform a correlated double sampling (CDS) operation in the post-calibration phase to compensate for other noise (i.e., 60-cycle noise) in the system 100. During the CDS period indicated in FIG. 3, a CDS output during a touch event in the presences of touch conducted noise coupling can be expressed as:

$$V_{OUT}(T_1) = \frac{\Delta V_G + V_n(T_1)}{C_F} \Delta C_B + V_{CM} \quad (7)$$

$$V_{OUT}(T_2) = \frac{-\Delta V_G + V_n(T_2)}{C_F} \Delta C_B + V_{CM} \quad (8)$$

such that $$\begin{aligned}
V_{OUT,CDS} &= V_{OUT}(T_1) - V_{OUT}(T_2) \\
&= 2\frac{\Delta V_G}{C_F} \Delta C_B + \frac{\Delta C_B}{C_F}(V_n(T_1) - V_n(T_1))
\end{aligned} \quad (9)$$

As can be seen from equation (9), the noise component is $V_n(T_1) - V_n(T_2)$, so, by increasing the sampling period (i.e., $T_S = T_1 - T_2$), the noise can be made very small.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
an interface that is configured to communicate with a touch sensor having a base capacitance; and
a capacitance-to-voltage converter that receives a clock signal and that is coupled to the interface, wherein the capacitance-to-voltage converter generates gain control and offset signals, and wherein the capacitance-to-voltage converter is configured to apply the gain control signals to the touch sensor during a first phase of the clock signal, and the gain and offset control signals are adjusted to compensate for the base capacitance, and wherein the capacitance-to-voltage converter uses the gain and offset control signals during a second phase of the clock signal to compensate for the base capacitance and provide a touch capacitance measurement.

2. The apparatus of claim 1, wherein the output circuit includes a capacitor that is configured to be adjustable.

3. The apparatus of claim 2, wherein the capacitance-to-voltage converter further comprises:
 a gain control circuit that is coupled to the interface and that receives the clock signal;
 an output circuit that is coupled to the gain control circuit, wherein the output circuit includes the capacitor; and
 an offset control circuit that is coupled to the output circuit and that receives the clock signal.

4. The apparatus of claim 3, wherein the gain control circuit further comprises:
 a first transmission gate that is coupled between the interface and the output circuit and that is activated during the second phase of the clock signal;
 a second transmission gate that is coupled to the interface and that is activated during the first phase of the clock signal; and
 a digital-to-analog converter (DAC) that is coupled to the second transmission gate and that generates the gain control signal.

5. The apparatus of claim 4, wherein the DAC further comprises a first DAC, and wherein the gain control circuit further comprises:
 a second DAC that generates the offset control signal;
 a third transmission gate that is coupled between the second DAC and the output circuit and that is activated during the second phase of the clock signal; and
 a fourth transmission gate that is coupled to the output circuit and that is activated during the first phase of the clock signal.

6. The apparatus of claim 5, wherein the clock signal further comprises a first clock signal, and wherein the capacitor further comprises a first capacitor, and wherein the output circuit further comprises:
 a second capacitor that is coupled to the third and fourth transmission gates;
 an amplifier having a first input terminal, a second input terminal, and a output terminal, wherein the first input terminal of the amplifier is coupled to the second capacitor and the first transmission gate, and wherein the first capacitor is coupled between the first input terminal of the amplifier and the output terminal of the amplifier, and wherein the second input terminal of the amplifier receives a common mode voltage; and
 a fifth transmission gate that is controlled by the second clock signal and that is coupled between the first input terminal of the amplifier and the output terminal of the amplifier.

7. The apparatus of claim 5, wherein the capacitor further comprises a first capacitor, and wherein the output circuit further comprises:
 a second capacitor that is coupled to the offset control circuit; and
 an amplifier having a first input terminal, a second input terminal, and a output terminal, wherein the first input terminal of the amplifier is coupled to the second capacitor and the gain control circuit, and wherein the first capacitor is coupled between the first input terminal of the amplifier and the output terminal of the amplifier, and wherein the second input terminal of the amplifier receives a common mode voltage.

8. The apparatus of claim 5, wherein the clock signal further comprises a first clock signal, and wherein the output circuit further comprises a first transmission gate that is controlled by the second clock signal and that is coupled between the first input terminal of the amplifier and the output terminal of the amplifier.

9. The apparatus of claim 8, wherein the gain control circuit further comprises:
 a DAC that generates the offset control signal;
 a second transmission gate that is coupled between the DAC and the second capacitor and that is activated during the second phase of the clock signal; and
 a third transmission gate that is coupled to the second capacitor and that is activated during the first phase of the clock signal.

10. The apparatus of claim 9, wherein the DAC further comprises a first DAC, and wherein the gain control circuit further comprises:
 a fourth transmission gate that is coupled between the interface and the first input terminal of the amplifier and that is activated during the second phase of the clock signal;
 a fifth transmission gate that is coupled to the interface and that is activated during the first phase of the clock signal; and
 a second DAC that is coupled to the second transmission gate and that generates the gain control signal.

11. The apparatus of claim 10, wherein the touch panel controller further comprises:
 an analog-to-digital converter (ADC) that is coupled to the output terminal of the amplifier;
 a digital front end (DFE) that is coupled to the ADC; and
 control logic that is coupled to the DFE, the first and second DACs, and the first, second, third, fourth, and fifth transmission gates.

12. The apparatus of claim 11, wherein the ADC is a successive approximation register (SAR) ADC.

13. The apparatus of claim 12, wherein the DFE provides noise cancellation using correlated double sampling (CDS).

14. An apparatus comprising:
 a touch panel having a plurality of touch sensors, wherein each touch sensor has a base capacitance;
 a touch panel controller having:
  an interface that is coupled to each touch sensor;
  a capacitance-to-voltage converter having:
   a gain control circuit that is coupled to the interface and that receives a clock signal, wherein the gain control circuit generates a gain control signal, and wherein the gain control circuit is configured to apply the gain control signal to a selected touch sensor from the plurality of touch sensors during a first phase of the clock signal;
   an output circuit that is coupled to the gain control circuit, wherein the output circuit is configured to be coupled to the touch sensor during a second phase of the clock signal; and
   an offset control circuit that is coupled to the output circuit and that receives the clock signal, wherein the offset control circuit generates an offset control signal, and wherein the offset control circuit applies the offset control signal to the output circuit during the second phase of the clock signal, and wherein the gain and offset control signals are adjusted to compensate for the base capacitance of the selected touch sensor.

15. The apparatus of claim 14, wherein the output circuit includes a capacitor that is configured to be adjustable.

16. A method comprising:
- generating gain and offset control signals, wherein the gain and offset control signals are adjusted to compensate for base capacitance of a touch sensor;
- applying the gain control signal to a touch sensor during a first phase of a clock signal;
- applying the offset control signal to an output circuit during a second phase of the clock signal;
- coupling the output circuit to the touch sensor during the second phase of the clock signal;
- compensating for the base capacitance with the gain and offset control signals to generate a touch capacitance measurement; and
- applying a gain to the touch capacitance measurement.

17. The method of claim 16, wherein the step of applying the gain control signal further comprises coupling a DAC to the touch sensor during the first phase of the clock signal.

18. The method of claim 17, wherein the method further comprises converting the touch measurement with the applied gain to a digital signal.

19. The method of claim 18, wherein the method further comprises performing a CDS operation on the digital signal to compensate for noise.

\* \* \* \* \*